United States Patent [19]

Stewart

[11] Patent Number: 4,868,430
[45] Date of Patent: Sep. 19, 1989

[54] SELF-CORRECTING DIGITALLY CONTROLLED TIMING CIRCUIT

[75] Inventor: John W. Stewart, Wichita, Kans.

[73] Assignee: NCR Corporation, Dayton, Ohio

[21] Appl. No.: 154,768

[22] Filed: Feb. 11, 1988

[51] Int. Cl.$^4$ .............................................. H03K 5/13
[52] U.S. Cl. .................................... 307/602; 307/597;
307/271; 307/269; 328/55; 328/72; 328/155;
377/20; 377/45
[58] Field of Search ............... 307/271, 269, 602, 597;
328/155, 72, 55; 377/20, 45

[56] References Cited

U.S. PATENT DOCUMENTS

| | | | |
|---|---|---|---|
| 3,815,108 | 6/1974 | McGrath et al. | 360/41 |
| 3,852,810 | 12/1974 | McGrath et al. | 360/51 |
| 4,131,920 | 12/1978 | Berger | 360/51 |
| 4,275,466 | 6/1981 | Yamamoto | 375/113 |
| 4,504,749 | 3/1985 | Yoshida | 307/271 |
| 4,520,408 | 5/1985 | Velasquez | 360/51 |
| 4,524,448 | 6/1985 | Hüllwegen | 375/118 |
| 4,564,870 | 1/1986 | Kitamura | 360/51 |
| 4,573,017 | 2/1986 | Levine | 307/271 |
| 4,607,296 | 8/1986 | Smidth | 360/51 |
| 4,675,546 | 6/1987 | Shaw | 307/602 |
| 4,737,700 | 4/1988 | Doelves | 307/271 |

*Primary Examiner*—John S. Heyman
*Attorney, Agent, or Firm*—Wilbert Hawk, Jr.; Stephen F. Jewett; Jack R. Penrod

[57] ABSTRACT

A digitally controlled timing circuit for providing an output pulse signal precisely delayed with respect to an input signal irrespective of the time of occurrence of a system clock, but which uses the precision of the system clock to self-correct any inaccuracy in the delay includes a plurality of delay elements, the delay period of a respective one of which is adjustable, coupled between an input terminal, to which an input terminal is applied, and an output terminal, from which a delayed output signal is to be derived. Coupled to the input terminal and the plurality of delay elements is a toggled flip-flop which, with the delay elements, during a calibrate mode, forms an adjustable oscillator and generates a sequence of signals the lapse of time between successive ones of which is established by delays imparted by selected ones of the delay elements. The delays imparted by selected ones of the delay elements. The output of the flip-flop is coupled to a shift register/counter which is used to measure the length of time required for the flip-flop to generate a prescribed number of signals after its receipt of an input signal. Upon counting a prescribed number of signals generated by the flip-flop the shift register/counter delivers an output signal to a comparator, which compares the length of time measured by the shift register/counter with a reference length of time. Depending upon the comparison, an up/down counter is incremented or decremented. Decoded contents of the counter are used to adjust the delay elements.

17 Claims, 4 Drawing Sheets

SELF-CORRECTING DIGITALLY CONTROLLED TIMING CIRCUIT

FIELD OF THE INVENTION

The present invention relates in general to timing signal generation circuits and is particularly directed to a circuit arrangement for using a synchronous clock signal to produce pulse signals occurring at intervals which are asynchronous with respect to, and the widths of which may be shorter than, the period of the synchronous clock.

BACKGROUND OF THE INVENTION

Digital signal processing apparatus, such as interface circuits for data storage disk drives, frequently require the capability of executing signal processing operations with highly accurate timing, irrespective of the frequency and time of occurrence of a basic system clock that controls the majority of events within a system. Attempting to generate a timing signal asynchronously with respect to the system clock by using multiple occurrences of the clock signal is not necessarily precise, or even possible, particularly where the initiation point of the timing signal is selected at a time that falls immediately subsequent to a transition in the system clock. For example, in a data processing system operating off a precision 20 MHz. crystal reference, clock signals occur at intervals of 50 ns. By simply counting five consecutive clock signals one could ostensibly generate a 250 ns. delay pulse. However, if the clock count begins at a time which is slightly subsequent to the most recent clock signals (e.g. one ns. later), then the actual time of occurrence of a transition edge of the intended 250 ns. pulse may be retarded by nearly one clock cycle (49 ns. in the example). Because of this inherent uncertainty window in using a fixed system clock, it is common practice to achieve a desired delay using 'trimmable' components, such as RC delay circuits, and monostable multivibrators (one-shots), and precision delay lines. Unfortunately, within a given circuit architecture, the insertion of individual delay components cannot always be readily accomplished and often requires the use of a separate 'off-chip' timing circuit, which increases hardware complexity and is subject to drift. Precision delay lines are not subject to the drift problem; however, they add considerable cost and, consequently, are most practically employed in 'higher ticket' items such as memories.

SUMMARY OF THE INVENTION

In accordance with the present invention, the above-mentioned drawbacks of using 'off-chip' components and the uncertainty window inherent with timing schemes that initiate delay times with respect to a system clock are obviated by a digitally controlled timing circuit which is capable of providing an output pulse signal precisely delayed with respect to an input signals irrespective of the time of occurrence of a system clock, but which uses the precision of the system clock to self-correct any inaccuracy in the delay. For this purpose, the digitally controlled timing circuit includes a plurality of delay elements, the delay period of a respective one of which is adjustable, coupled between an input terminal, to which an input signal is applied, and an output terminal, from which a delayed output signal is to be derived. Coupled to the input terminal and the plurality of delay elements is a toggled flip-flop which, in conjunction with the delay elements during a calibrate mode of operation of the circuit, forms an adjustable oscillator and generates a sequence of signals the lapse of time between successive ones of which is established by delays imparted by selected ones of the delay elements. The output of the flip-flop is coupled to a shift register/counter which is used to measure the length of time required for the flip-flop to generate a prescribed number of signals after its receipt of an input signal. Upon counting a prescribed number of signals generated by the flip-flop, the shift register/counter delivers an output signal to a comparator, which compares the length of time measured by the shift register/counter with a reference length of time. This comparison is accomplished by using the precision system crystal clock as an input signal and comparing whether the measured length of time falls within the period of the clock signal. Depending upon the comparison, an up/down counter is incremented or decremented. Stages of this counter are coupled to a decoder, outputs of which are applied to the delay elements to adjust their delay periods.

As successive clock signals are applied to the input terminal, the output signal delivered by the shift register/counter will be incrementally retarded and shortened as the comparator adjusts (increments and decrements) the contents of the up/down counter, as a result of the relationship between the measured lapse of time interval and the time of occurrence of the next clock signal. Namely, during the calibrate mode, the output of the shift register/counter provides a feedback control signal for adjusting the delay periods of the delay elements about a proximity value that establishes the intended delay. Because the signal processing delay of each element is only a small fraction of the period of the system clock, effectively any desired delay over a clock cycle can be achieved during a signal processing mode by simply cascading selected ones of the delay stages together or (logically) tapping selected ones of a group of cascaded delay stages. Preferably, the calibrate mode of operation is periodically employed to provide a regular adjustment of the settings of the delays and thereby ensure continued precision operation.

With the ability to generate a highly accurate delay signal, the timing circuit of the present invention is readily adapted for use as a precision timing signal discriminator. For this purpose, a prescribed number of delay elements are connected in cascade between the input and the shift register/counter. The output of the shift register/counter is then used to gate a subsequently occurring input signal. If the next input signal occurs after the generation of an output signal by the shift register/counter, indicating that the time interval between input signals is longer than the precision delay set by the circuit, then the timing circuit is allowed to set a latch, the output of which is representative of whether the repetition rate of successive input signals exceeds a value preestablished by the delay. This discrimination capability enables the present invention to be employed for the detection of precise timing signals, such as sync fields during magnetic disk read operations.

The precision with which delays considerably shorter than the period of the system clock can be generated enables the invention to be used to provide timing precompensation of data that is to be written to a magnetic disk and thereby counter the timing distortion that inherently occurs whenever the data requires closely spaced flux transitions in an area of lesser concentration on the disk. Such precise precompenstation allows the data to be read back from the disk as if no timing distortion had occurred.

DETAILED DESCRIPTION

Figure 1:
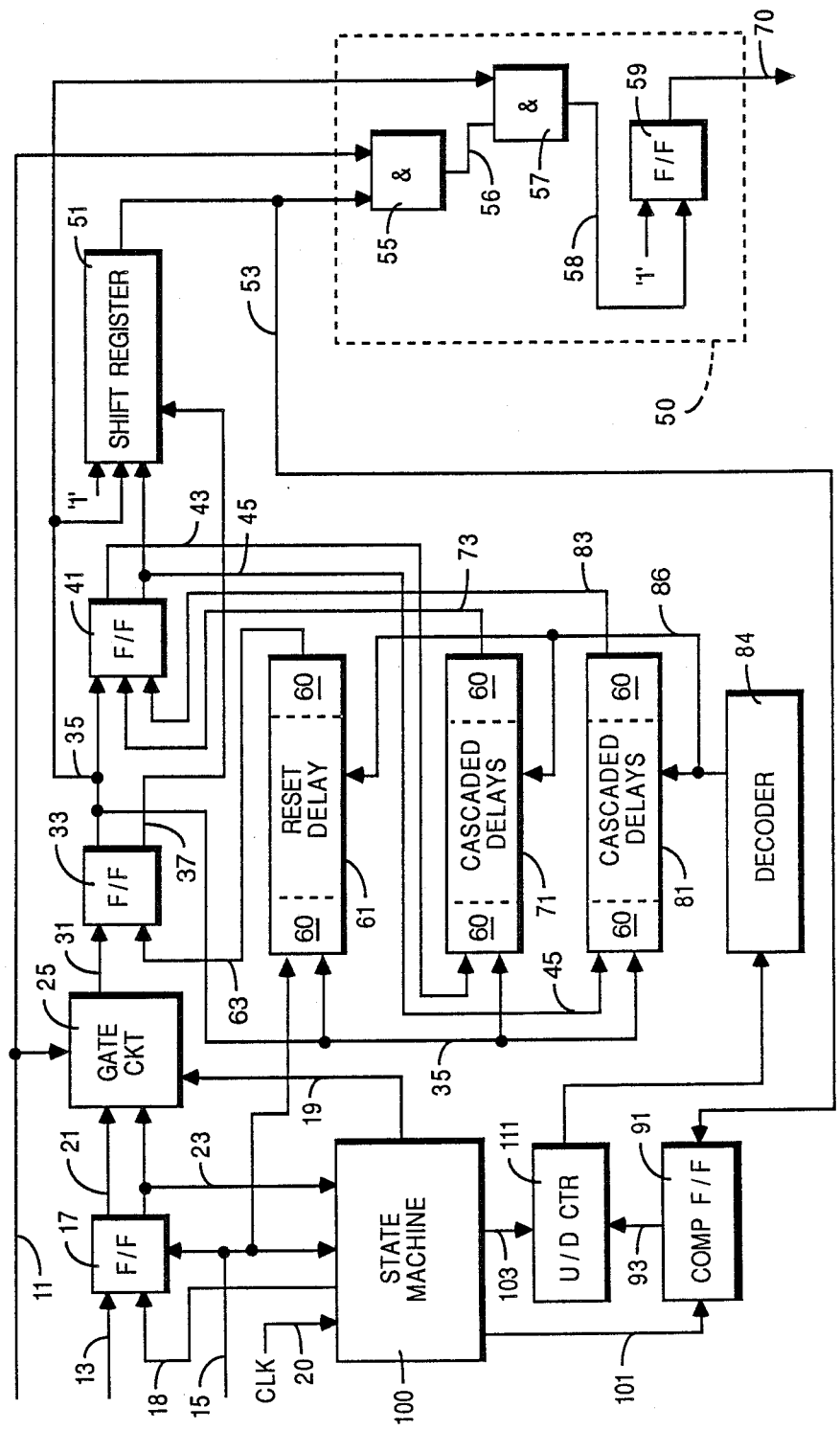
FIG. 1 diagrammatically illustrates a first embodiment of the invention as a self-correcting digitally controlled pulse discriminator circuit, generating a delay signal as a precision timing reference.

Before describing in detail the particular improved self-correcting digital controlled timing circuit in accordance with the present invention, it should be observed that the present invention resides primarily in a novel structural combination of conventional digital signal processing circuits and components and not in the particular detailed configurations thereof. Accordingly, the structure, control and arrangement of these conventional circuits and components have been illustrated in the drawings by readily understandable block diagrams which show only those specific details that are pertinent to the present invention, so as not to obscure the disclosure with structural details which will be readily apparent to those skilled in the art having the benefit of the description herein. Thus, the block diagram illustrations of the Figures do not necessarily represent the mechanical structural arrangement of the exemplary system, but are primarily intended to illustrate the major structural components of the system in a convenient functional grouping, whereby the present invention may be more readily understood.

Referring now to FIG. 1, there is diagrammatically illustrated a first embodiment of the invention employed as a self-correcting digitally controlled pulse discriminator circuit. As will be described below, this timing circuit is useful for effecting a precision discrimination of preselected types of timing signals, such as sync fields, the detection of which is required during magnetic disk read operations carried out by a magnetic disk drive interface. As an example, a 5 megabit/sec disk system may employ sync fields having data transitions spaced apart from one another by 200 ns. The discriminator circuit configuration illustrated in FIG. 1 may be set to provide a precise delay of 250 ns and reject fields if the time of occurrence between successive data transitions exceeds the delay time. In other words, true sync fields, the rate of transitions of which are normally in the neighborhood of 200 ns, will be passed, while those of longer time intervals will be rejected.

For this purpose, input signals to be processed are coupled over an input link 11 to one input of an input gate circuit 25, a second input of which is coupled to a link 19 from a state machine 100. Link 11 is also coupled to a downstream AND gate 55 which forms part of timing discrimination circuit 50, to be described below. During the calibrate mode of operation of the timing circuit, link 19 provides a precise periodic timing signal referenced to a crystal-generated system clock supplied to state machine 100 over link 20. One of these outputs is supplied over link 18 to the clock input of a flip-flop 17 to the D input of which a calibrate mode-representative signal is supplied over link 13. A system reset signal is supplied over link 15 to flip-flop 17 and to an initializing reset delay circuit 61, to be described below. The Q and $\bar{Q}$ outputs of flip-flop 17 are supplied over links 21 and 23, respectively, as control inputs of input gate circuit 25 for controlling which of the links 11 or 19 will be coupled at the output of gate circuit 25 to be supplied via link 31 to an input flip-flop 33. The $\bar{Q}$ output of flip-flop 33 is coupled over link 35 as a master reset signal to a downstream shift register 51, gate 57, discriminator delay circuits 71 and 81 and to the input of local input delay circuit 61. The Q output of flip-flop 33 is coupled over link 37 to the reset inputs of the respective states of shift register 51.

Each of delay circuits 61, 71 and 81 is comprised of a plurality of cascaded, individually adjustable digital delay elements 60, the effective delay imparted by each of which is presettable by way of a control code supplied over link 86 from a decoder 84. Each individual digitally adjustable delay element 60 within respective cascaded delay stages 61, 71 and 81 has a delay range on the order of 2 to 4 ns., the specific delay imparted by each element cell being defined by the contents of the code on link 86 from decoder 84, as noted above.

Reset delay stage 61 supplies a prescribed delay output over link 63 to the reset input of flip-flop 33, for the purpose of permitting the system to stabilize after a master reset and initiate a sequence of events during the calibrate mode of operation.

As pointed out above, the Q output of flip-flop 33 is coupled over link 35 as a master reset signal to various portions of the discriminator circuit. One of these components is a flip-flop 41, to a gated reset input of which link 35 is coupled. A second reset gated input of flip-flop 41 is coupled via link 83 to the output of cascaded delay stage 81. The set input of flip-flop 41 is coupled over link 73 from the output of cascaded delay stage 71. The Q output of flip-flop 41 is coupled over link 43 to the input of cascaded delay stage 71, while the $\bar{Q}$ output of flip-flop 41 is coupled over link 45 to a downstream shift register 51 and to the input of cascaded delay stage 81.

The number of delay elements within each of cascaded delay stages 71 and 81 is selected to establish a prescribed discrimination timing window upon which the circuit of FIG. 1 will operate. As described previously, for locating sync field data transitions during a disk read operation, the discriminator circuit shown in FIG. 1 is preferably configured to provide a discrimination time window of 250 ns. For this purpose, the overall effective delay provided by the cascaded delay elements 60 within each of delay stages 71 and 81 is set at 120 ns. Of course, it is to be observed that the present invention is not limited to this particular application or to any specific time interval or delay. The parameters given here are simply for purposes of providing an illustrative example. Consequently, the number of delays stages may vary, depending, of course, upon the delay of each stage and the overall delay to be effected by the cascading of a plurality of such stages.

Shift register 51 is comprised of a plurality of stages, effectively acting as a counter or time measurement circuit to count transitions in the $\bar{Q}$ output of flip-flop 41 on link 45. Flip-flop 41 is toggled by way of a pair of bootstrap feedback loops including respective cascaded delay stages 71 and 81. As will be described below, during the description of the operation of the circuit, in response to a change of state in the respective output of flip-flop 41, the triggering edge signal propagates through a respective one of a delay stages and then toggles the flip-flop 41 to the opposite state. The corresponding transition in the complementary output of the flip-flop 41 then traverses the other one of delay stages 71 and 81 and then toggles the flip-flop 41 to its previous state. As this complementary action continues, a pulse stream is supplied to shift register 51. After a prescribed number of pulses have been clocked through the shift register, an output is supplied over link 53 to a first input of a flip-flop 91, which serves as a time of occurrence comparator. A second input of flip-flop/comparator 91 is supplied over link 101 from state machine 100. Based upon the repetition rate or the calibration signal supplied over link 19, link 101 from state machine 100 supplies a clock signal which arrives at flip-flop/comparator 91 at a precise time interval subsequent to the edge of the clock signal on link 19. Depending on whether the output of shift register/counter 51 is advanced or retarded with respect to the signal on line 101, the output of flip-flop 91 will be one of two count direction-representative states. Specifically, output 93 from the flip-flop 91 is coupled to an up/down counter 111, the respective stages of which are coupled to stated decoder 84. The output of decoder 84 is coupled over link 86 to supply a delay parameter adjustment control code to each of the delay elements 60 within respective cascaded delay stages 61, 71 and 81. The incrementing/decrementing of up/down counter 111 is effected by a clock signal on link 103 from state machine 100 which will be explained below.

Figure 3:
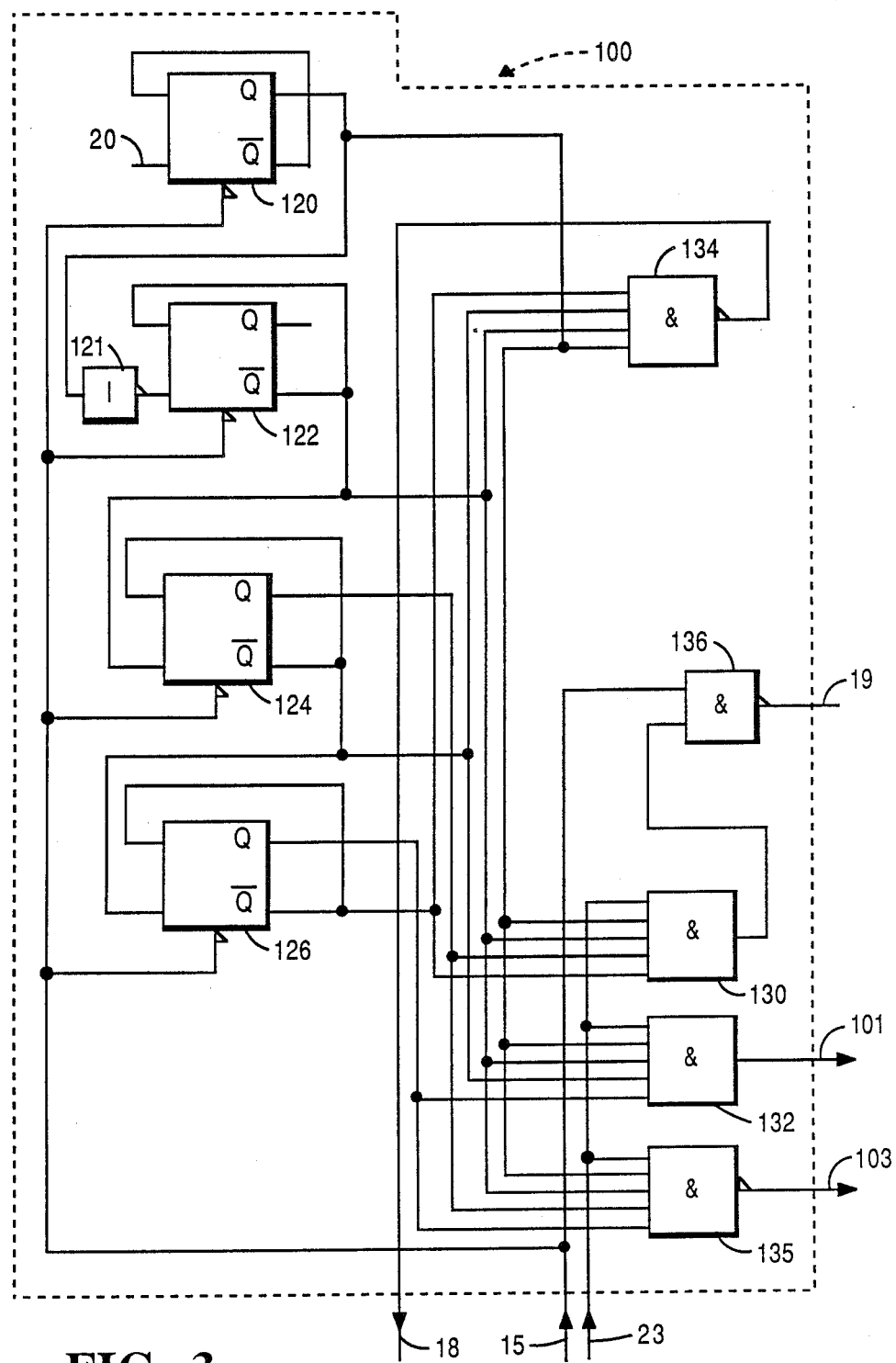
FIG. 3 diagrammatically illustrates an embodiment of a state machine for sequencing the invention.

Referring now to FIG. 3, one embodiment of the state machine 100 is shown. The state machine 100 is comprised of flip-flops and combinational logic, although other possible circuit variations and modifications will occur to those skilled in the art and therefor this embodiment is considered only exemplary and is not meant to be limiting, to produce precision timing signals referenced to the system clock.

The crystal-generated system clock is supplied on link 20 to the clock input of a D-flip-flop 120. The $\overline{Q}$ output is connected to its own D input, and the Q output is connected to a clock input of a D-flip-flop 122 through an inverter 121. The $\overline{Q}$ output of the flip-flop 122 is connected to its own D input and to a clock input of a D-flip-flop 124. The $\overline{Q}$ output of the flip-flop 124 is connected to its own D input and to a clock input of a D-flip-flop 126. The $\overline{Q}$ output of the flip-flop 126 is connected to its own D input. The reset inputs of D-flip-flops 120–126 are connected to link 15.

Figure 4:
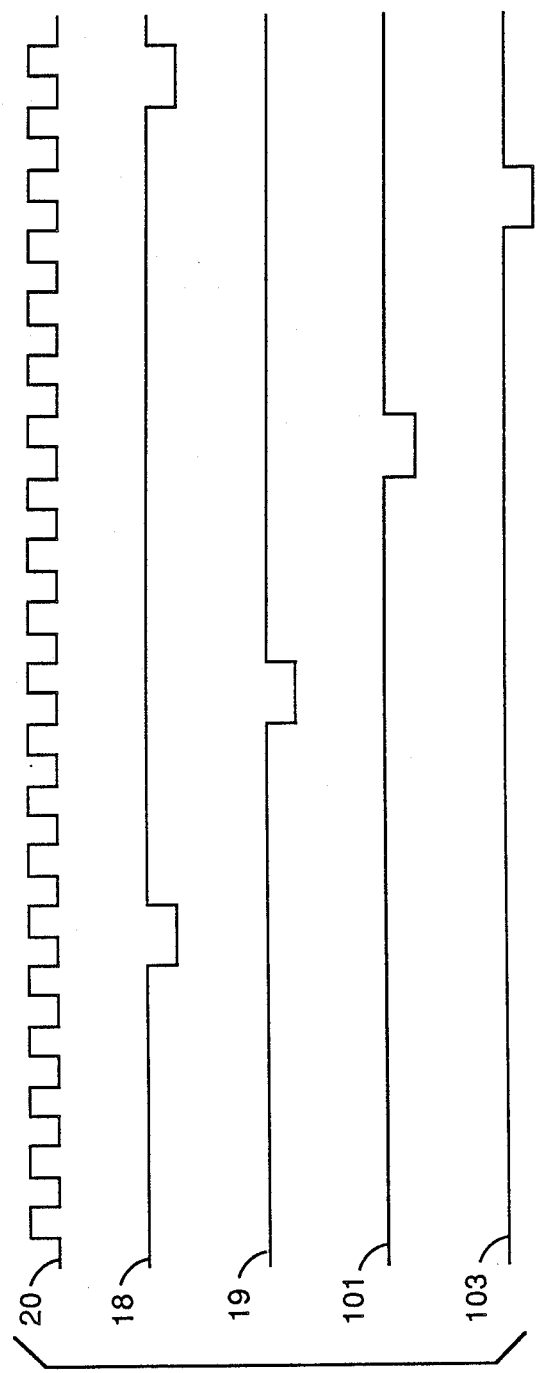
FIG. 4 illustrates the timing of the state machine outputs with respect to the system clock input.

When connected in this manner, the D-flip-flops 120–126 form a divider circuit which divides the system clock input supplied on link 20 by factors of 2, 4, 8 and 16. Further, both the Q and the $\overline{Q}$ outputs are available as inputs to combinational logic circuits. The outputs of the flip-flops 120–126 are interconnected to AND gates 130, 132 and NAND gates 134, 136, 138 where they are logically combined to provide timing signals, as shown in FIG. 4. The designation numbers in FIG. 4 correspond to the input or output link of state machine 100 upon which the respective timing signal occurs. These timing signals from state machine 100 are used to sequence the circuit shown in FIG. 1 through the operation modes described below.

Operation

As described previously, the timing circuit shown in FIG. 1 operates in one of two modes: 1. calibrate mode, and 2. discrimination mode.

Calibrate Mode

Prior to being placed in operation as a timing signal discriminator (e.g., locating potential sync fields during a magnetic disk read operation) the effective delay provided by each of the cascaded delay stages is a calibrated by reference to a precision clock signal derived from the crystal system clock. It should also be noted that this calibration procedure may be carried out at any time during system operation by a control input on link 13.

More particularly, to initiate the calibrate mode of operation, and assuming that a system reset signal has been applied over link 15 to reset flip-flop 17 and cascaded delay stage 61; a calibrate mode-representative logic state signal is supplied over link 13 to flip-flop 17. On the basis of the precision crystal-source clock signal supplied over link 20 to state machine 100, all subsequent events will be referenced to the system clock. Initially, state machine 100 produces a clock signal on link 18 to clock a calibrate mode-representative signal over input link 23 to input gate circuit 25. The complementary logic level reversals on links 23 and 21 effectively decouples the discriminator input 11 portion of input gate circuit 25 and couples the calibrate mode portion of input gate circuit 25 to output link 31.

State machine 100 next generates an initial one of a sequence of periodic calibration clock signals over link 19. The first of these signals sets flip-flop 33, the output of which is coupled over link 35 as an input to local reset cascaded delay stage 61. After a nominal delay imparted by initialization reset delay stage 61, an output signal is supplied over link 35. The change in state on output link 35 toggles flip-flop 41, to change the state of respective output links 43 and 45. The leading edge of the signal on one of these output links will propagate down one of cascaded delay stages 71, 81 and supply a complementary toggle input over one of the links 73, 83 to flip-flop 41. Flip-flop 41 is then toggled to change state, so that a complementary action takes place at its output and the leading edge of the complementary output signal then transits down the other one of delay stages 71, 81. This repeated complementary switching action causes the output states to flip-flop 41 to switch back and forth or effectively oscillate, thereby providing a series of pulse signals as a clock input to shift register 51. The initial stage of shift register 51 is hardwired to a prescribed logic level, which is sequentially shifted through the cascaded stages of the shift register and eventually causes a change in state of output link 53. Output 53 is also coupled to the discriminator circuit 50, to be described below in conjunction with the description of the discrimination mode of operation.

The change in state of output link 53 is coupled to the D input of flip-flop/comparator 91, which is clocked by a signal over link 101 from state machine 100, as noted previously. Depending upon the overall effective delay imparted by each of the elements of cascaded delay stages 71 and 81, the change in state on link 53 will either lead or lag the clock transition on link 101 from state machine 100. The combinational logic of the state machine 100 is defined in accordance with an expected operational delay imparted by delay stages 71 and 81, so that, during actual operation, the time of occurrence of the transition on link 53 and the clock transition on link 101 will fall within the nominal delay capability of the respective delay stages. Depending upon whether the transition on link 53 leads or lags the transition on link 101, the output of flip-flop 91, which acts as count direction control signal for up/down counter 111, will cause counter 111 to be incremented or decremented on the next clock transition on link 103. As the contents of up/down counter 111 are directionally controlled by the timing relationship between the signal on link 53 and the signal on link 101, the respective stages of counter 111 are decoded by decoder 84 and converted into a delay element control code supplied over link 86 to each of the delay elements 60 of cascaded delay stages 61, 71 and 81. As successive clock pulses generated by state machine 100 are supplied over link 19 and processed in the manner described above, the incrementing/decrementing of up/down counter 111 will converge to a region within which counter 111 is alternately incremented and decremented about a nominal count value, so as to effectively maintain the delay control code supplied over link 86 at a value such that the overall effective delay imparted by delay stages 71 and 81 is within a nominal tolerance for the circuit.

To terminate the calibrate mode of operation, the logic level state of input link 13 is reversed, thereby disabling the calibrate mode portion of input gate circuit 25 and allowing input signals supplied on link 11 to propagate through the system. On the next clock transition on link 18, the Q output of flip-flop 17 on link 23 changes state, disabling the gating circuitry within state machine 100, so that clock signals are no longer supplied on output links 19, 101 and 103.

Timing Signal Discrimination Mode

During the discrimination mode of operation of the circuit, the calibration feedback loop via link 53 at the output of shift register 51 is disabled because of the absence of output signals on links 101 and 103 from the state machine 100. However, the bootstrap oscillation loop through flip-flop 41 and cascaded gate stages 71 and 81 and the counting operation of shift register 51 continues, in order to perform the discrimination function.

More particularly, with the circuit calibrated and enabled for processing of an input signal on link 11, a logic level transition on input link 11 will be coupled through input gate circuit 25 and set flip-flop 33. The same sequence of operations described above during the calibrate mode of operation, specifically the local reset delay through delay stage 61 and the bootstrap toggling of flip-flop 41 through delay stages 71 and 81 will proceed. Assuming that the circuit is properly calibrated, then it can be expected that any subsequent transition on input link 11 which falls within the discrimination window for which the circuit has been set (e.g., 250 ns for a 200 ns sync field) will supply an enabling input to gate 55 of discriminator circuit 50. As long as this input on link 11 precedes the timeout effected by shift register 51, then the generation of an output signal on link 53 will be passed through gate 55 and disable gate 57 prior to the receipt of the master reset signal from cascaded gate delay stage 61 onto link 35 by the operation of flip-flop 33. As a consequence, gate 57 will not couple the signal on link 56 to input 58 of flip-flop 59 and the logic level of an output 70 of flip-flop 59 will not change state, indicating that the input signal of interest on link 11 falls within the discrimination window effected by the circuit. On the other hand, if the signal on input link 11 exceeds the delay window imparted by the discrimination circuit, then the output from shift register 51 will precede the change in state on input link 11 and be coupled through gate 57, to cause flip-flop 59 to change state.

As noted above, the calibrate mode of operation may be effected at any time simply by changing the state of input link 13. During the calibrate mode, signals on link 11 are not processed, the outputs of state machine 100 are enabled and the above described correction control loop via link 53 from shift register 51 to up/down counter 111 is used to adjust the delay element control codes supplied over link 86 from decoder 84 and set the delay of each of the delay elements of stages 61, 71 and 81.

Figure 2:
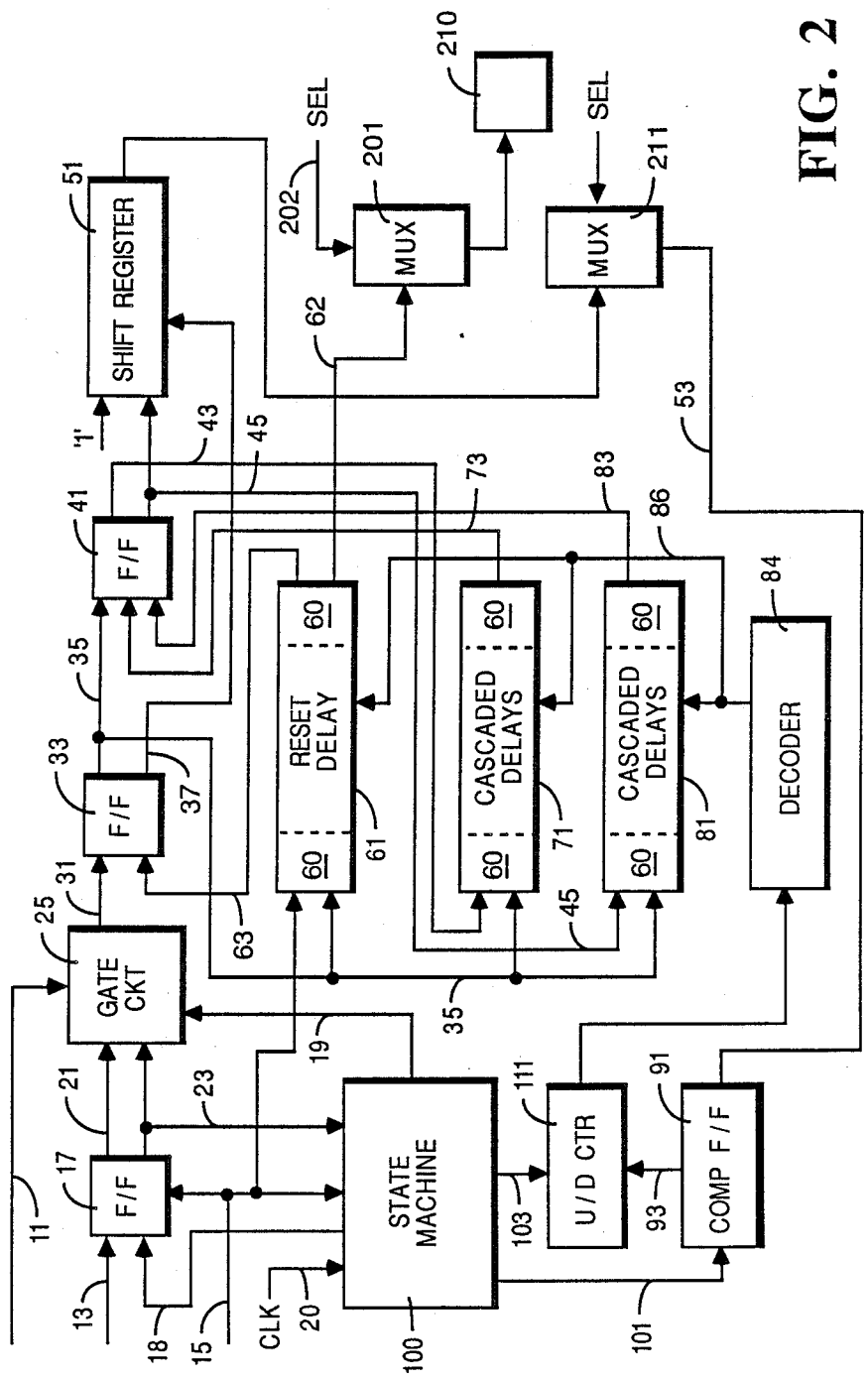
FIG. 2 diagrammatically illustrates a second embodiment of the invention as a self-correcting digitally controlled precompensation timing circuit.

Referring now to FIG. 2, there is illustrated a second embodiment of the present invention employed as a self-correcting, digitally controlled precompensation timing circuit. Specifically, the configuration shown in FIG. 2 is substantially the same as that shown in FIG. 1 except for the fact that the precompensation timing circuit of FIG. 2 is employed to provide a precisely controlled selectable delay and does not include the discrimination function of the configuration shown in FIG. 1. Namely, the output of shift register/counter circuit 51 is coupled to a multiplexer 211, the output of which is coupled over link 53 to comparator 91. Multiplexer 211 controllably couples selected ones of the stages of the shift register 51 to output link 53 so as to control the measurement interval carried out by shift register 51.

In addition, selected ones of the delay elements of cascaded delay stage 61 are coupled over a link 62 to a multiplexer 201. In response to select inputs on link 202, multiplexer 201 selectively connects the outputs of respective delay elements 60 of which delay stage 61 is comprised to an output terminal 210. In a disk interface environment as described above, the circuit shown in FIG. 2 may provide a selectable timing delay of values of approximately 30 ns. Assuming that cascaded delay stage 61 is comprised of eight individual delay elements, each of which provides a delay on the order of 3 ns, then by selectively coupling the outputs of the delay elements via the multiplexer 201 to output terminal 210, a precompensation delay between 0 and 24 ns may be provided.

The calibrate mode of operation of the embodiment shown in FIG. 2 is identical to that shown in FIG. 1. During the precompensation mode, the state of input link 13 is reversed, inhibiting the outputs generated by the state machine 100 and allowing an input signal applied to input link 11 to propagate through delay stage 61 with the desired precompensation delay extracted at output terminal 210 in accordance with the control setting of multiplexer 201.

As will be appreciated from the foregoing description, the above-mentioned drawbacks of using off-chip components and an uncertainty window of timing schemes that initiate delays in synchronism with a system clock are obviated in accordance with the present invention by a digitally controlled timing circuit which is capable of providing an output pulse signal precisely delayed with respect to an input signal irrespective of the time of occurrence of a system clock, but which uses the precision of the system clock to self-correct any inaccuracy in the delay. Because the signal processing delay of each delay element within the timing circuit is only a small fraction of the period of the system clock, effectively any desired delay over a clock cycle can be achieved during a signal processing mode by simply cascading selected ones of the delay stages together or logically tapping selected ones of a group of cascaded delay stages.

With the ability to generate a highly accurate delay signal, the timing circuit of the present invention is readily adapted for use as a precision timing signal discriminator. This discrimination capability enables the present invention to be employed for the detection of precise timing signals, such as sync fields during magnetic disk read operations. In addition, the precision with which delays considerably shorter than the period of the system clock can be generated enables the invention to be used to provide timing precompensation of data that is to be written to a magnetic disk and thereby counter the timing distortion that inherently occurs whenever the data requires closely spaced flux transitions in an area of lesser concentration on the disk. Such precise precompensation allows the data to be read back from the disk as if no timing distortion had occurred.

While I have shown and described several embodiments in accordance with the present invention, it is to be understood that the same is not limited thereto but is susceptible of numerous changes and modification as known to a person skilled in the art, and I therefore do not wish to be limited to the details shown and described herein but intend to cover all such changes and modifications as are obvious to one of ordinary skill in the art.

What is claimed is:

1. A circuit for producing an output signal the time of occurrence of which is delayed with respect to an input signal applied thereto comprising:
   first means, responsive to an input signal, for generating a sequence of first signals;
   counter means coupled to said first means for counting successive ones of said first signals and generating a second signal upon counting a preselected number of said first signals to measure the length of time required for said first means to generate a prescribed number of said first signals after receipt of an input signal by said first means;
   control means, coupled to said first means, for controllably adjusting and setting the lapse of time between successive ones of said first signals in accordance with the time of occurrence of said second signal relative to a sequence of periodically occurring signals the lapse of time between successive ones of which corresponds to said reference length of time applied to said first means as an input signal; and
   second means for producing an output signal delayed with respect to an input signal in accordance with the lapse of time between successive ones of said first signals.

2. A circuit according to claim 1, wherein said control means comprises an up/down counter the contents of which are controllably incremented or decremented in accordance with whether the length of time between a respective one of said periodically occurring signals and said second signal exceeds the length of time between successive ones of said periodically occurring signals.

3. A circuit according to claim 2, wherein said first means comprises a plurality of cascaded delay elements, the delay period of a respective one of which is adjustable, to which said first signals are coupled for setting the lapse of time between successive ones of which, and said control means includes means for controllably adjusting the delay of each of said delay elements in accordance with the contents of each of said delay elements in accordance with the contents of said up/down counter.

4. A circuit for producing an output signal the time of occurrence of which is delayed with respect to an input signal applied thereto comprising:
   first means, responsive to an input signal, for generating a sequence of first signals and including adjustable delay means for controllably adjusting the lapse of time between successive ones of said first signals;
   second means, coupled to said first means, for producing an output signal in response to said first means generating a prescribed number of said first signals after receipt of an input signal by said first means; and
   third means, coupled to said first and second means, for controllably adjusting the lapse of time between successive ones of said first signals in accordance with a prescribed relationship between the length of time elapsed between an input signal and the production of an output signal by said second means and a reference length of time; said third means includes means, coupled to receive said input signal and said output signal, for generating a second signal representative of whether or not said output signal is generated by said second means prior to receipt of a further input signal by said first means.

5. A circuit according to claim 4, further including fourth means, coupled to said adjustable delay means and coupled to receive said input signal, for selectively generating a delay signal corresponding to a version of said input signal delayed by a time interval produced by a selected portion of said adjustable delay means.

6. A circuit according to claim 4, wherein said third means comprises control means for controllably adjusting the lapse of time between successive ones of said first signals in accordance with the time of occurrence of said output signal relative to a reference signal applied to said first means as an input signal.

7. A circuit according to claim 6, wherein said reference signal comprises a sequence of periodically occurring signals the lapse of time between successive ones of which corresponds to said reference length of time.

8. A circuit according to claim 7, wherein said third means comprises an up/down counter the contents of which are controllably incremented or decremented in accordance with whether the length of time between a respective one of said periodically occurring signals and said output signal exceeds the length of time between successive ones of said periodically occurring signals.

9. A circuit according to claim 7, wherein said first means comprises a plurality of cascaded delay elements, the delay period of a respective one of which is adjustable, to which said first signals are coupled for setting the lapse of time between successive ones of which, and said third means comprises means for controllably adjusting the delay of each of said delay elements in accordance with the contents of said up/down counter.

10. A circuit for producing an output signal the time of occurrence of which is delayed with respect to an input signal applied thereto comprising:

an input terminal to which an input signal is applied;

an output terminal from which an output signal corresponding to a delayed version of said input signal is to be derived;

a plurality of delay elements, the delay period of a respective one of which is adjustable, coupled between said input terminal and said output terminal;

first means, coupled to said input terminal and said plurality of delay elements, for generating a sequence of first signals the lapse of time between successive ones of which is established by delays imparted by elements of said plurality;

second means, coupled to said first means, for measuring the length of time required for said first means to generate a prescribed number of said first signals after receipt of an input signal by said first means;

third means, coupled to said plurality of delay elements, for controllably setting the delay periods thereof; and an up/down counter the contents of which are controllably incremented or decremented in accordance with whether the length of time between a respective one of said periodically occurring signals and said second signal exceeds the length of time between successive ones of said periodically occurring signal, coupled to said second and third means, for controllably adjusting the delay period of each of said delay elements in accordance with a prescribed relationship between the length of time measured by said second means and a reference length of time.

11. A circuit according to claim 10, wherein said second means comprises counter means for counting successive ones of said first signals and generating a second signal upon counting a preselected number of said first signals.

12. A circuit according to claim 11, wherein said up/down counter includes means, coupled to receive said input signals and said second signal, for generating a third signal representative of whether or not said second signal is generated by said second means prior to receipt of a further input signal by said first means.

13. A circuit according to claim 11, further comprising control means connected to said up/down counter for controllably adjusting the delay periods of each of said delay elements in accordance with the time of occurrence of said second signal relative to a reference signal applied to said first means as an input signal.

14. A circuit according to claim 13, wherein said reference signal comprises a sequence of periodically occurring signals the lapse of time between successive ones of which corresponds to said reference length of time.

15. A circuit according to claim 10, further comprising decoder means coupled between stages of said up/down counter and said third means for controllably adjusting the delay of each of said delay elements in accordance with the contents of said up/down counter.

16. A circuit for producing an output signal the time of occurrence of which is delayed with respect to an input signal applied thereto comprising:

an input terminal to which an input signal is applied;

a first flip-flop having a first input for setting said flip-flop to a first state connected to said input terminal;

said first flip-flop having a non-inverted output terminal and an inverted output terminal;

a first delay device having an input terminal connected to said non-inverted output terminal for receiving a signal therefrom and an output terminal connected to a second input terminal of said first flip-flop for resetting said flip-flop;

a second flip-flop having a first input terminal for setting said second flip-flop connected to said non-inverting output terminal;

a second delay device having an input terminal connected to an inverting output terminal of said second flip-flop for receiving a signal therefrom and an output terminal connected to a second input of said second flip-flop for resetting said second flip-flop;

a third delay device having an input terminal connected to a non-inverting output terminal of said second flip-flop for receiving a signal therefrom and an output terminal connected to a third input of said second flip-flop for setting said second flip-flop; and shift register means having a data input terminal connected to a fixed logic level and a shift input terminal connected to said inverted output terminal of said second flip-flop for shifting said fixed logic level from said input terminal to an output terminal thereof;

whereby said input signal sets said first flip-flop and an output signal of said first delay device resets said first flip-flop after a first preselected delay, said second flip-flop is set by an output signal on said inverted output terminal of said first flip-flop by a resetting thereof, said second delay device resets said second flip-flop after a second preselected delay, said third delay device sets said second flip-flop in response to a resetting thereof after a third preselected delay, which forms a self perpetuating oscillator having a preselected cycle time, and said shift register means shifts said fixed logic level by a multiple of said preselected cycle time to said output terminal thereof thereby delaying the output of said fixed logic level output by said multiple of preselected cycle times.

17. The circuit for producing an output signal the time of occurrence of which is delayed with respect to the input signal applied thereto, according to claim 16, further comprising a comparator means for comparing an arrival of a second input signal with respect to an arrival of the output signal of said shift register which is delayed with respect to said input signal thereto.

* * * * *